(12) United States Patent
Kushida (10) Patent No.: US 8,072,833 B2
(45) Date of Patent: Dec. 6, 2011

(54) SEMICONDUCTOR MEMORY DEVICE

(75) Inventor: Keiichi Kushida, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 195 days.

(21) Appl. No.: 12/641,247

(22) Filed: Dec. 17, 2009

(65) Prior Publication Data

US 2010/0157661 A1    Jun. 24, 2010

(30) Foreign Application Priority Data

Dec. 22, 2008    (JP) .................................. 2008-325042

(51) Int. Cl.
*G11C 8/00*    (2006.01)
*G11C 11/00*    (2006.01)

(52) U.S. Cl. ................................... 365/230.05; 365/154

(58) Field of Classification Search ............. 365/230.05, 365/154, 156

See application file for complete search history.

(56) References Cited

U.S. PATENT DOCUMENTS

| | | | | |
|---|---|---|---|---|
| 6,711,086 | B2 * | 3/2004 | Terada ...................... | 365/230.05 |
| 7,986,547 | B2 * | 7/2011 | Hirabayashi .................. | 365/156 |
| 2005/0152204 | A1 * | 7/2005 | Lee et al. ................. | 365/230.05 |
| 2007/0139997 | A1 * | 6/2007 | Suzuki et al. ................. | 365/154 |
| 2007/0195584 | A1 | 8/2007 | Imai et al. | |

FOREIGN PATENT DOCUMENTS

| | | |
|---|---|---|
| JP | 07-240095 | 9/1995 |
| JP | 11-007773 | 1/1999 |

OTHER PUBLICATIONS

H. Noguchi et al., "Which is the Best Dual-Port SRAM in 45-nm Process Technology?—8T, 10T Single End, and 10T Differential—"ICICDT IEEE, Jun. 2-4, 2008, pp. 55-58.
Explanation of Non-English Language References.

* cited by examiner

*Primary Examiner* — Anh Phung (74) *Attorney, Agent, or Firm* — Knobbe Martens Olson & Bear LLP (57) ABSTRACT

A semiconductor memory device includes a first write bit line, a second write bit line, a write word line, a first read bit line, a read word line, and a memory cell array including a plurality of memory cells, and arranged the plurality of memory cells in a matrix fashion, wherein the memory cells including a first inverter including a first PMOS transistor and a first NMOS transistor, a second inverter including a second PMOS transistor, and a second NMOS transistor, and including an input terminal and an output terminal connected to an output terminal and an input terminal of the first inverter, respectively, a first write transfer transistor connected between a first write bit line and the output terminal of the first inverter, and including a gate connected to a write word line, a second write transfer transistor connected between a second write bit line and the output terminal of the second inverter, and including a gate connected to the write word line, a first read driver transistor including a gate connected to the input terminal of any one of the first inverter and the second inverter, and a first read transfer transistor connected to a first read bit line through the first read driver transistor, and including a gate connected to a read word line, the first read transfer transistor shared by at least two of the memory cells in the memory cell array.

15 Claims, 12 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2008-325042, filed Dec. 22, 2008, the entire contents of which are incorporated herein by reference.

BACKGROUND

1. Technological Field

Embodiments discussed herein relate to a semiconductor memory device, and more specifically, to a semiconductor memory device including a cell array in which static random access memory (SRAM) cells are arranged 2. Description of the Related Art In general, a SRAM cell includes two inverters each made of a positive-channel metal-oxide semiconductor (PMOS) transistor and a negative-channel metal-oxide semiconductor (NMOS) transistor, and an input terminal and an output terminal of one of the two inverters are connected to an output terminal and an input terminal of the other inverter, respectively. Moreover, there has been known a configuration to provide the SRAM cell with a read port in addition to a write port in order to accelerate data reading out of this SRAM cell or to execute data reading in parallel with data writing. As a configuration of the read port, there has been known one including a read transfer transistor and a read driver transistor connected to the input terminal of any of the two inverters in the SRAM cell. In this case, each SRAM cell includes eight MOS transistors in total.

Meanwhile, as another configuration of the read port, there has also been known one including two pairs of read driver transistors and read transfer transistors respectively connected to the input terminals of the two inverters in the SRAM cell. In this case, each SRAM cell includes ten MOS transistors in total.

The cell size has been reduced along with a progress in scaling in recent years. In general, the value of a cell current to flow through a transistor is reduced by scaling down the transistor. However, it is preferable to feed a large cell current to a read transfer transistor in order to improve a readout characteristic of a read port. This has made it difficult to reduce the cell size of the read transfer transistor.

SUMMARY OF THE INVENTION

An exemplary embodiment described herein provides a semiconductor memory device including a first write bit line, a second write bit line, a write word line, a first read bit line, a read word line, and a memory cell array including a plurality of memory cells, and arranged the plurality of memory cells in a matrix fashion, wherein the memory cells including a first inverter including a first PMOS transistor and a first NMOS transistor, a second inverter including a second PMOS transistor, and a second NMOS transistor, and including an input terminal and an output terminal connected to an output terminal and an input terminal of the first inverter, respectively, a first write transfer transistor connected between a first write bit line and the output terminal of the first inverter, and including a gate connected to a write word line, a second write transfer transistor connected between a second write bit line and the output terminal of the second inverter, and including a gate connected to the write word line, a first read driver transistor including a gate connected to the input terminal of any one of the first inverter and the second inverter, and a first read transfer transistor connected to a first read bit line through the first read driver transistor, and including a gate connected to a read word line, the first read transfer transistor shared by at least two of the memory cells in the memory cell array.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Various other objects, features and attendant advantages of the exemplary embodiments described herein will be more fully appreciated from the following detailed description when considered in connection with the accompanying drawings in which like reference characters designate like or corresponding parts throughout the several views.

Now, embodiments of this invention will be described below with reference to the accompanying drawings.

First Embodiment

Figure 1:
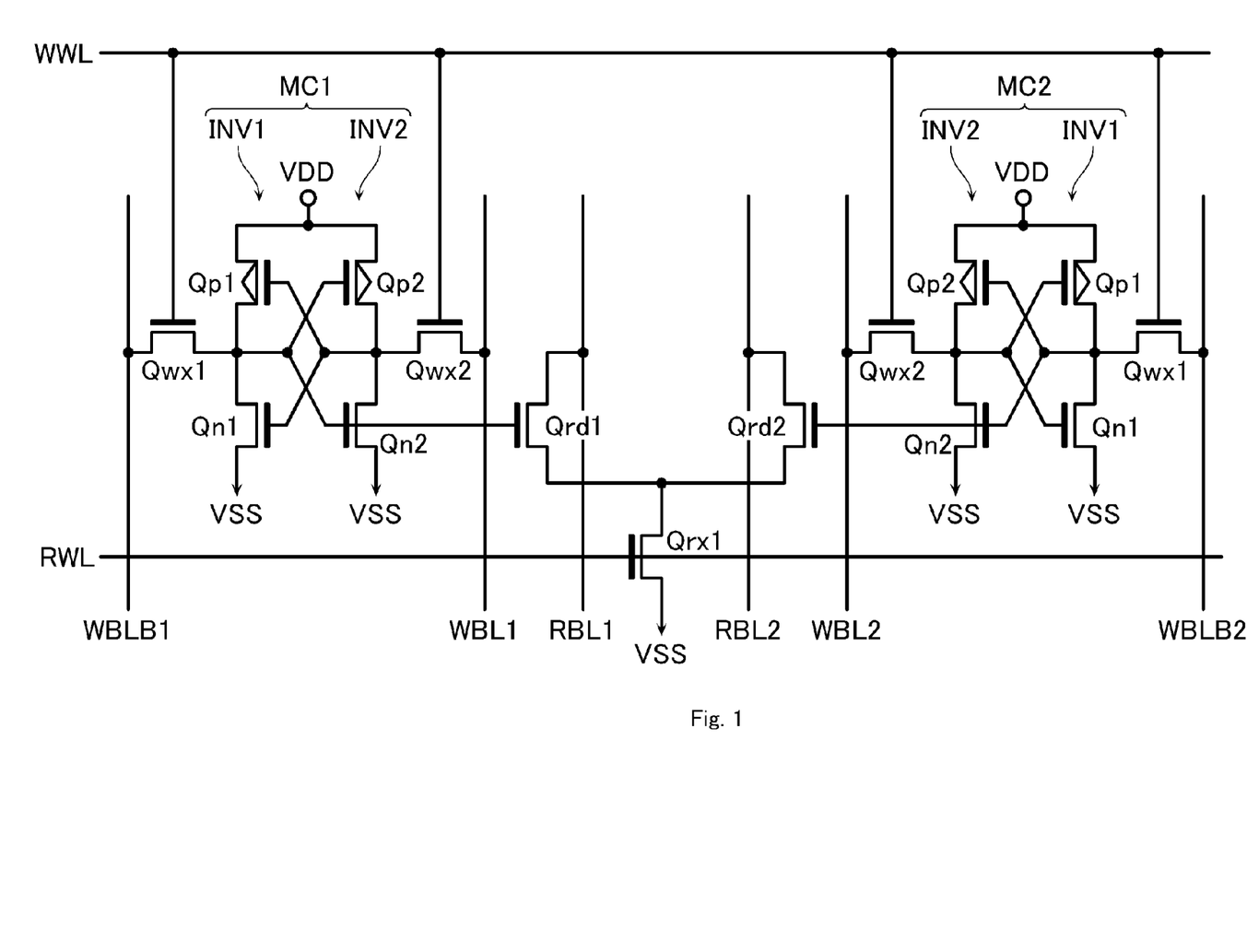
FIG. 1 is a circuit diagram of static random access memory (SRAM) cells according to a first embodiment of the present invention.

FIG. 1 is a circuit diagram of static random access memory (SRAM) cells MC used in a semiconductor memory device according to a first embodiment of the present invention.

The SRAM cells MC are arranged in a matrix fashion in a memory cell array of the semiconductor memory device according to this embodiment. FIG. 1 shows two SRAM cells MC1 and MC2. Each of the SRAM cells MC1 and MC2 includes a first inverter INV1 and a second inverter INV2. The first inverter INV1 includes a first positive-channel metal-oxide semiconductor (PMOS) transistor Qp1 and a first negative-channel metal-oxide semiconductor (NMOS) transistor Qn1. Here, sources of these transistors are connected to a power line VDD and a grounding line VSS, respectively, and these transistors are connected in series. The second inverter INV2 includes a second PMOS transistor Qp2 and a second NMOS transistor Qn2. Here, sources of these transistors are connected to the power line VDD and the grounding line VSS, respectively, and these transistors are connected in series. Input and output terminals of the first inverter INV1 are connected to output and input terminals of the second inverter INV2, respectively.

Meanwhile, a first write transfer transistor Qwx1 is connected between an output terminal of the first inverter INV1 and a first write bit line WBLBi (i=1, 2) and a second write transfer transistor Qwx2 is connected between an output terminal of the second inverter INV2 and a second write bit line WBLi (i=1, 2). Gates of the first and second write transfer transistors Qwx1 and Qwx2 are connected to a write word line WWL. In this embodiment, these first and second write transfer transistors Qwx1 and Qwx2 serve as write ports of the SRAM cells MC1 and MC2.

When data is written in the SRAM cells MC, voltages corresponding to the write data are applied to the write bit lines WBLi and WBLBi. Thereafter, the write transfer transistors Qwx1 and Qwx2 are conducted by selecting the write word line WWL, and the data is written in the SRAM cells MC.

A gate of a first read driver transistor Qrd1 is connected to the input terminal of the second inverter INV2. A drain of the first read driver transistor Qrd1 is connected to a read bit line RBL1, and a source thereof is connected to a drain of a first read transfer transistor Qrx1. A source of the first read transfer transistor Qrx1 is connected to the grounding line VSS, and a gate thereof is connected to a read word line RWL. In this embodiment, the read driver transistor Qrd1 and the read transfer transistor Qrx1 serve as a read port of the SRAM cell MC1.

When data is read out of the SRAM cells MC1 and MC2, the read transfer transistor Qrx1 is conducted by selecting the read word line RWL. Meanwhile, conducted and non-conducted states of the read driver transistor Qrd1 and a read driver transistor Qrd2 are controlled on the basis of data in the SRAM cells MC. Here, it is possible to detect the data held in the SRAM cells MC by feeding a read current to the read bit line RBL1 and a read bit line RBL2 to check whether or not the read current is discharged to the grounding line VSS.

The two SRAM cells MC1 and MC2 are arranged in a line-symmetric pattern on the memory cell array with the first read transfer transistor Qrx1 serving as the center line. In terms of the SRAM cell MC2, the constituents corresponding to those in the SRAM cell MC1 are designated by corresponding reference numerals and explanation thereof will be omitted.

In the SRAM cell array of this embodiment, the source of the read driver transistor Qrd1 in the SRAM cell MC1 is connected to a source of the read driver transistor Qrd2 in the SRAM cell MC2. Moreover, the source of the read driver transistor Qrd1 in the SRAM cell MC1 and the source of the read driver transistor Qrd2 in the SRAM cell MC2 are connected to the first read transfer transistor Qrx1 in common. Specifically, the single read transfer transistor Qrx1 is shared by the two adjacent SRAM cells MC1 and MC2.

Figure 2:
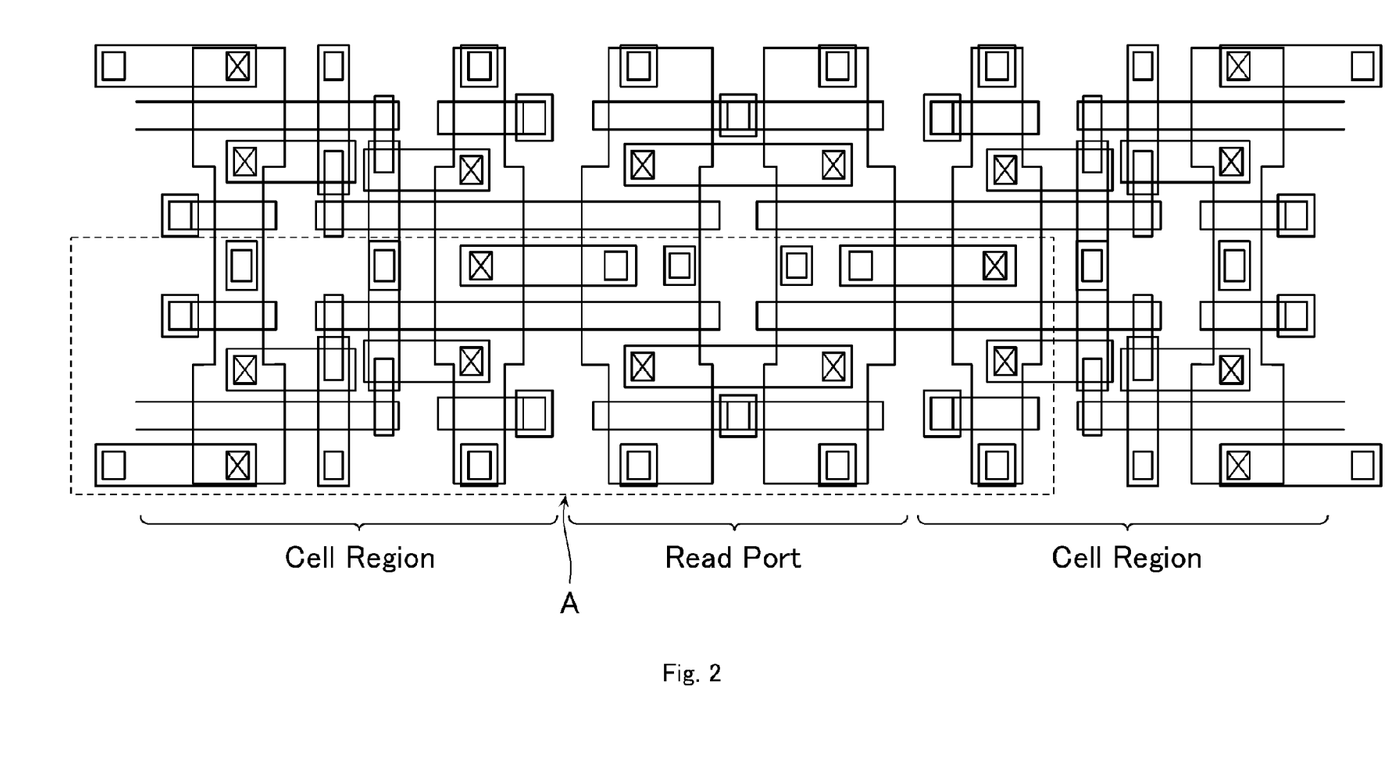
FIG. 2 is a plan view showing a layout on a semiconductor substrate of the SRAM cells according to the first embodiment.
Figure 3:
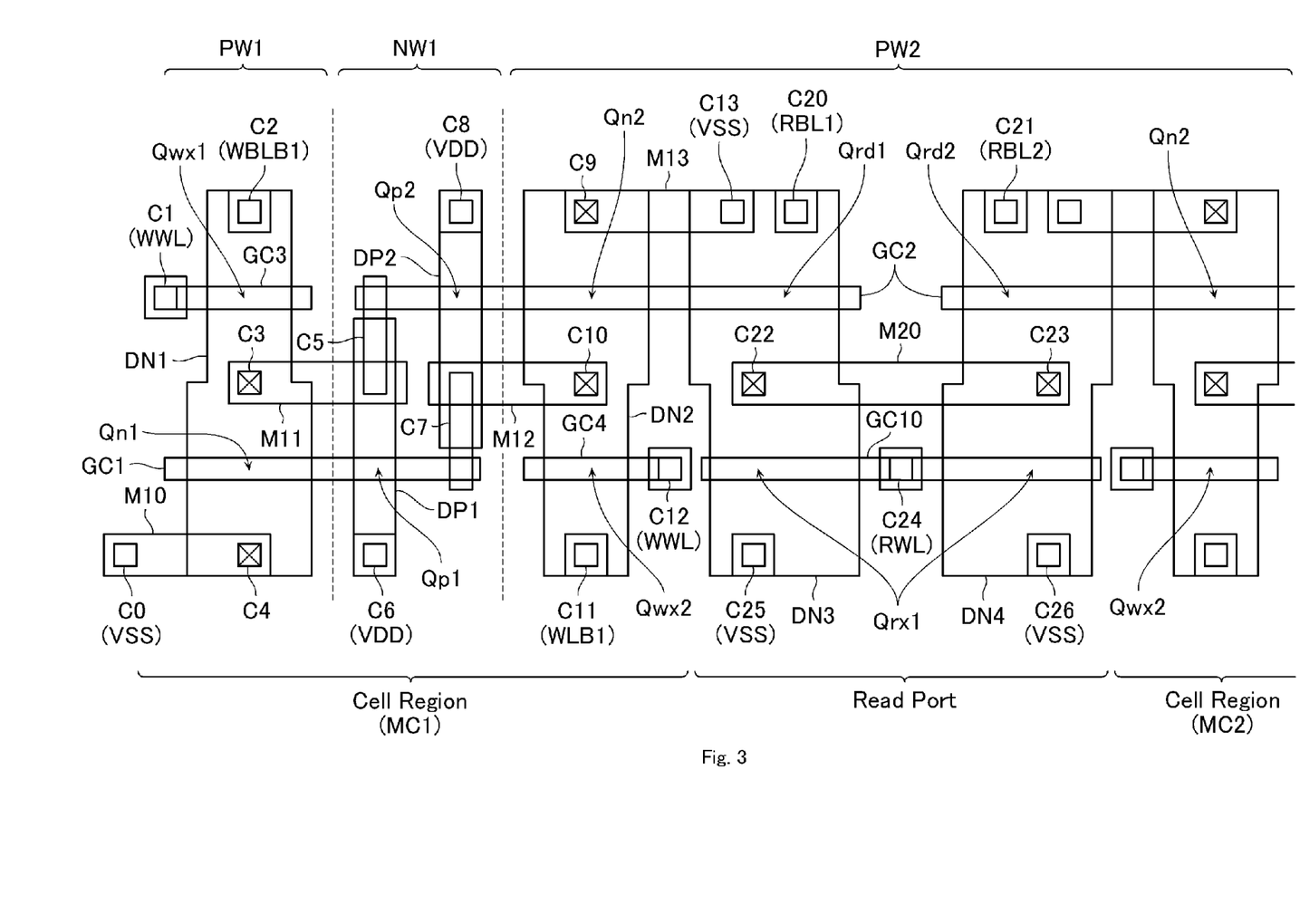
FIG. 3 is an enlarged plan view of the layout on the semiconductor substrate of the SRAM cells shown in FIG. 2.

FIG. 2 is a plan view showing a layout of the SRAM cells MC of this embodiment on a semiconductor substrate. FIG. 3 is an enlarged plan view of the layout of the SRAM cells MC shown in FIG. 2 on the semiconductor substrate. Note that these layouts illustrate overlapped layouts of layers ranging from a well region to a first metal line layer to be formed above the semiconductor substrate. The write word line WWL, the write bit lines WBL and WBLB, the read word line RWL, the read bit lines RBL, the power line VDD, and the grounding line VSS are formed along the well region on a second metal line layer located above the first metal line layer. However, these constituents are omitted in FIG. 2 and FIG. 3. Moreover, among contacts C0 to C26 to be described later, contacts indicated with blank boxes represent the contacts that are connected to lines formed on the second metal line layer, while contacts indicated with crossed boxes represent the contacts that are connected to the well region on the semiconductor substrate.

FIG. 2 shows: cell regions on the semiconductor substrate where the transistors constituting the SRAM cells MC and the write ports are to be formed; and a read port region on the semiconductor substrate where the transistors constituting the read port are to be formed. FIG. 2 illustrates a layout of four SRAM cells and the read port. Now, a concrete configuration of the SRAM cell will be described by using FIG. 3 which is the enlarged view of a portion surrounded by a broken line A in FIG. 2.

The transistors Qn1, Qn2, Qp1, and Qp2 constituting the single SRAM cell MC and the transistors Qwx1 and Qwx2 constituting the write port are formed substantially in a point-symmetric pattern within three well regions: p-well regions PW1, PW2, and an n-well region NW1 parallel to one another. The well regions PW1 and PW2 are located on both sides of the well region NW1. N-type diffusion layers DN1 and DN2 having strip shapes and extending parallel to these p-well regions PW1 and PW2 are respectively formed in the p-well regions PW1 and PW2. P-type diffusion layers DP1 and DP2 having strip shapes and extending parallel to the n-well region NW1 are formed in the n-well region NW1.

The first NMOS transistor Qn1 and the first write transfer transistor Qwx1 are serially formed along the n-type diffusion layer DN1 in the p-well region PW1. Meanwhile, the first and second PMOS transistors Qp1 and Qp2 are respectively formed along the p-type diffusion layers DP1 and DP2 in the n-well region NW1. Moreover, the second NMOS transistor Qn2 and the second write transfer transistor Qwx2 are serially formed along the n-type diffusion layer DN2 in the p-well region PW2.

A gate GC1 common to the transistors Qn1 and Qp1 is formed of polycrystalline silicon in a strip shape which traverses a boundary between the well regions NW1 and PW1. A gate GC2 common to the transistors Qn2 and Qp2 is formed of polycrystalline silicon in a strip shape which traverses a boundary between the well regions NW1 and PW2. Drains of the transistors Qn1 and Qp1 are connected to each other through a metal line M11 that traverses the boundary between the well regions NW1 and the PW1 and are connected to the gate GC2 common to the transistors Qn2 and Qp2 through a contact C5. Meanwhile, drains of the transistors Qn2 and Qp2 are connected to each other through a metal line M12 that traverses the boundary between the well regions NW1 and the PW2 and are connected to the gate GC1 common to the transistors Qn1 and Qp1 through a contact C7. Sources of the transistors Qp1 and Qp2 are connected to the power line VDD provided on the second metal line layer located above through contacts C6 and C8. A source of the transistor Qn1 is connected to the grounding line VSS through a contact C4, a metal line M10, and a contact C0. A source of the transistor Qn2 is connected to the grounding line VSS through a contact C9, a metal line M13, and a contact C13.

Each of gates GC3 and GC4 of the write transfer transistors Qwx1 and Qwx2 is formed of polycrystalline silicon in a strip shape which traverses the well region PW1 or PW2 and is connected to the write word line WWL through a contact C1 or C12. Sources of the write transfer transistors Qwx1 and Qwx2 are respectively connected to the bit lines WBLB1 and WBL1 through contacts C2 and C11. In the n-type diffusion layer DN1, a drain of the first write transfer transistor Qwx1 is serially connected to the drain of the first NMOS transistor Qn1 and is connected to the metal line M11 through a contact C3. Meanwhile, in the n-type diffusion layer DN2, a drain of the second write transfer transistor Qwx2 is serially connected to the drain of the second NMOS transistor Qn2 and is connected to the metal line M12 through a contact C10.

The transistors Qrd1, Qrd2, and Qrx1 constituting the read port are formed substantially in a point-symmetric pattern within the p-well region PW2. The read driver transistors Qrd1 and Qrd2 as well as the first read transfer transistor Qrx1, which are used by the two adjacent SRAM cells MC1 and MC2, are formed in the p-well region PW2. Here, although illustration of the structure is substantially omitted in FIG. 3, the SRAM cell MC1 and the SRAM cell MC2 adjacent thereto are formed into a line-symmetric pattern while interposing the region for forming the read port therebetween.

N-type diffusion layers DN3 and DN4 having strip shapes and extending parallel to the p-well region PW2 are formed in the p-well region PW2. The first read driver transistor Qrd1 is formed along the n-type diffusion layer DN3 in the p-well region PW2. Meanwhile, the second read driver transistor Qrd2 is formed along the n-type diffusion layer DN4.

The gate GC2 common to the transistors Qn2 and Qp2 of the SRAM cell MC1 extends to the n-type diffusion layer DN3 and functions as the gate common to the first read driver transistor Qrd1 as well. Meanwhile, the gate GC2 common to the transistors Qn2 and Qp2 of the SRAM cell MC2 also extends to the n-type diffusion layer DN4 and functions as the gate common to the second read driver transistor Qrd2 as well. The drains of the first and second read driver transistors Qrd1 and Qrd2 are respectively connected to the read bit lines RBL1 and RBL2 through contacts C20 and C21. The sources of the first and second read driver transistors Qrd1 and Qrd2 are connected to each other through contacts C22 and C23 and a metal line M20.

In the n-type diffusion layer DN3, the sources of the first and second read driver transistors Qrd1 and Qrd2 are serially connected to the drain of the first read transfer transistor Qrx1. A gate GC10 of the first read transfer transistor Qrx1 is connected to the read word line RWL through a contact C24 and the source thereof is connected to the grounding line VSS through contacts C25 and C26. In the n-type diffusion layers DN3 and DN4, the drain of the first read transfer transistor Qrx1 is connected to the first and second read driver transistors Qrd1 and Qrd2 in common, and the first read transfer transistor Qrx1 functions as the single transistor for which conduction is controlled by the read word line RWL. In this way, the single read transfer transistor Qrx is shared by the two adjacent SRAM cells MC1 and MC2.

Figure 4:
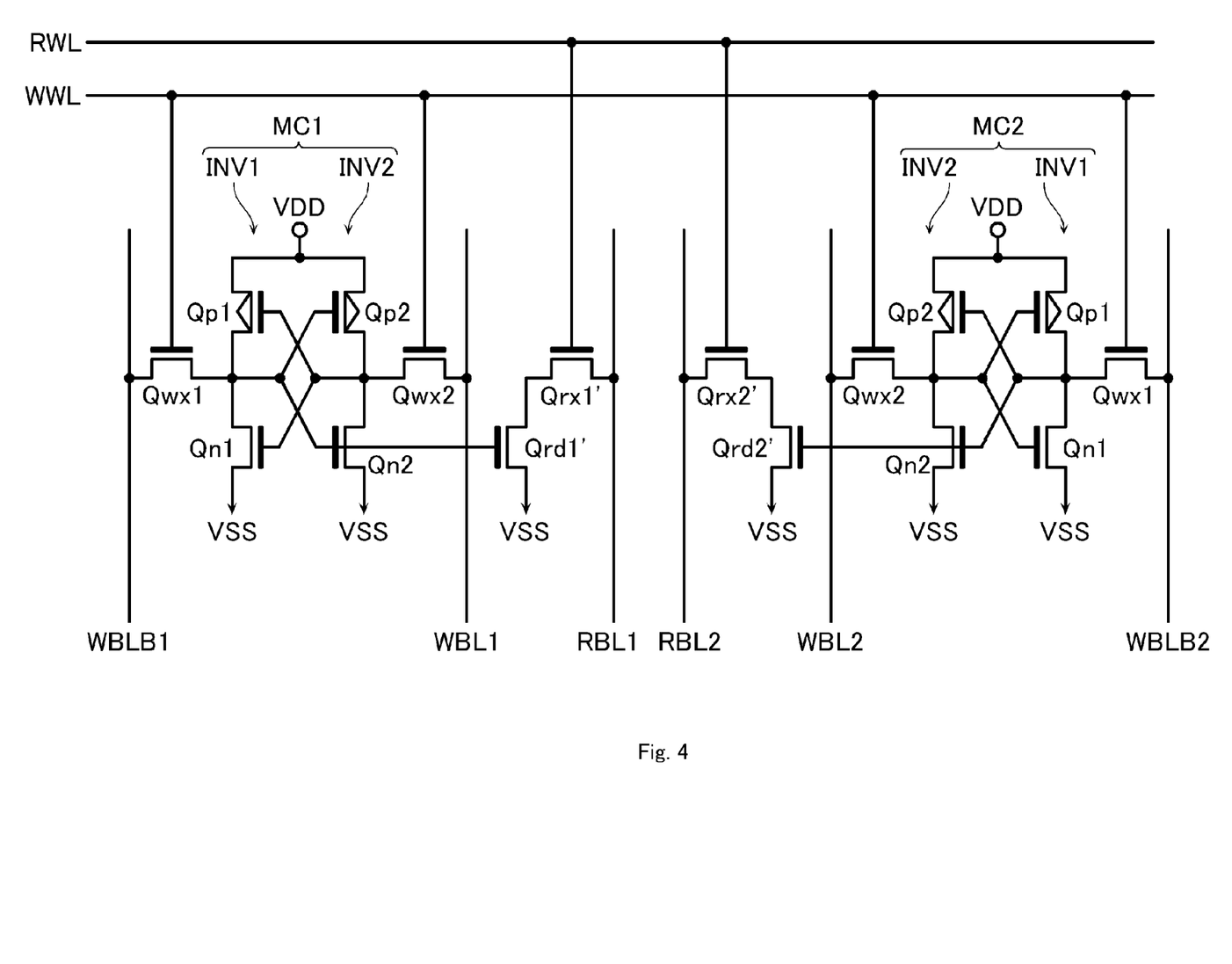
FIG. 4 is a circuit diagram of SRAM cells according to a comparative example.

Next, the read port of this embodiment will be described with reference to FIG. 4. FIG. 4 is a circuit diagram of SRAM cells used in a semiconductor memory device of a comparative example. The SRAM cells MC1 and MC2 in the comparative example have similar configurations to those described in conjunction with the first embodiment. Accordingly, constituents relevant to those in the first embodiment will be designated by relevant reference numerals and explanation thereof will be omitted. The SRAM cells MC of the comparative example have different structures of read driver transistors Qrd and read transfer transistors Qrx from those in the first embodiment.

In FIG. 4, a gate of a first read driver transistor Qrd1' is connected to the input terminal of the second inverter INV2 of the SRAM cell MC1. A drain of the first read driver transistor Qrd1' is connected to the first read bit line RBL1 through a first read transfer transistor Qrx1'. Meanwhile, a source of the first read driver transistor Qrd1' is connected to the grounding line VSS.

A gate of a second read driver transistor Qrd2' is connected to the input terminal of the second inverter INV2 of the SRAM cell MC2 which is adjacent to the SRAM cell MC1. A drain of the second read driver transistor Qrd2' is connected to the second read bit line RBL2 through a second read transfer transistor Qrx2'. Meanwhile, a source of the second read driver transistor Qrd2' is connected to the grounding line VSS. Gates of the read transfer transistors Qrx1' and Qrx2' are connected to the read word line RWL.

In FIG. 4, the read driver transistors Qrd1' and Qrd2' and the read transfer transistors Qrx1' and Qrx2' constitute the read port. Accordingly, in the semiconductor memory device of the comparative example, one memory cell inclusive of the read port is formed by using eight transistors. In the semiconductor memory device of the comparative example, when data is read out of the SRAM cells MC, the read transfer transistors Qrx1' and Qrx2' are conducted by selecting the read word line RWL. Meanwhile, conducted and non-conducted states of the read driver transistors Qrd1' and Qrd2' are controlled on the basis of data in the SRAM cells MC. Here, it is possible to detect the data held in the SRAM cells MC by feeding the read current to the read bit lines RBL1 and RBL2 to check whether or not the read current is discharged to the grounding line VSS.

The semiconductor memory device of the comparative example includes the read transfer transistors Qrx1' and Qrx2' which are provided on drain sides of the read driver transistors Qrd1' and Qrd2'. The drain sides of the read driver transistors Qrd1' and Qrd2' must be connected to the bit lines RBL1 and RBL2 separately. Therefore, it is not possible to control reading operations unless the two read transfer transistors are used therein.

On the other hand, in the SRAM cells MC according to the above-described first embodiment, the first read transfer transistor Qrx1 is disposed on the source sides of the read driver transistors Qrd1 and Qrd2 and is shared by the two adjacent SRAM cells MC. Since both of the source sides of the read driver transistors Qrd1 and Qrd2 are connected to the grounding line VSS, it is possible to control the conducted and non-conducted states of these transistors by using the single transistor. In this way, the pair of SRAM cells MC according to this embodiment can reduce the number of transistors disposed on the read port by one. Therefore, it is possible to reduce the cell size of the SRAM cells MC.

Second Embodiment

Figure 5:
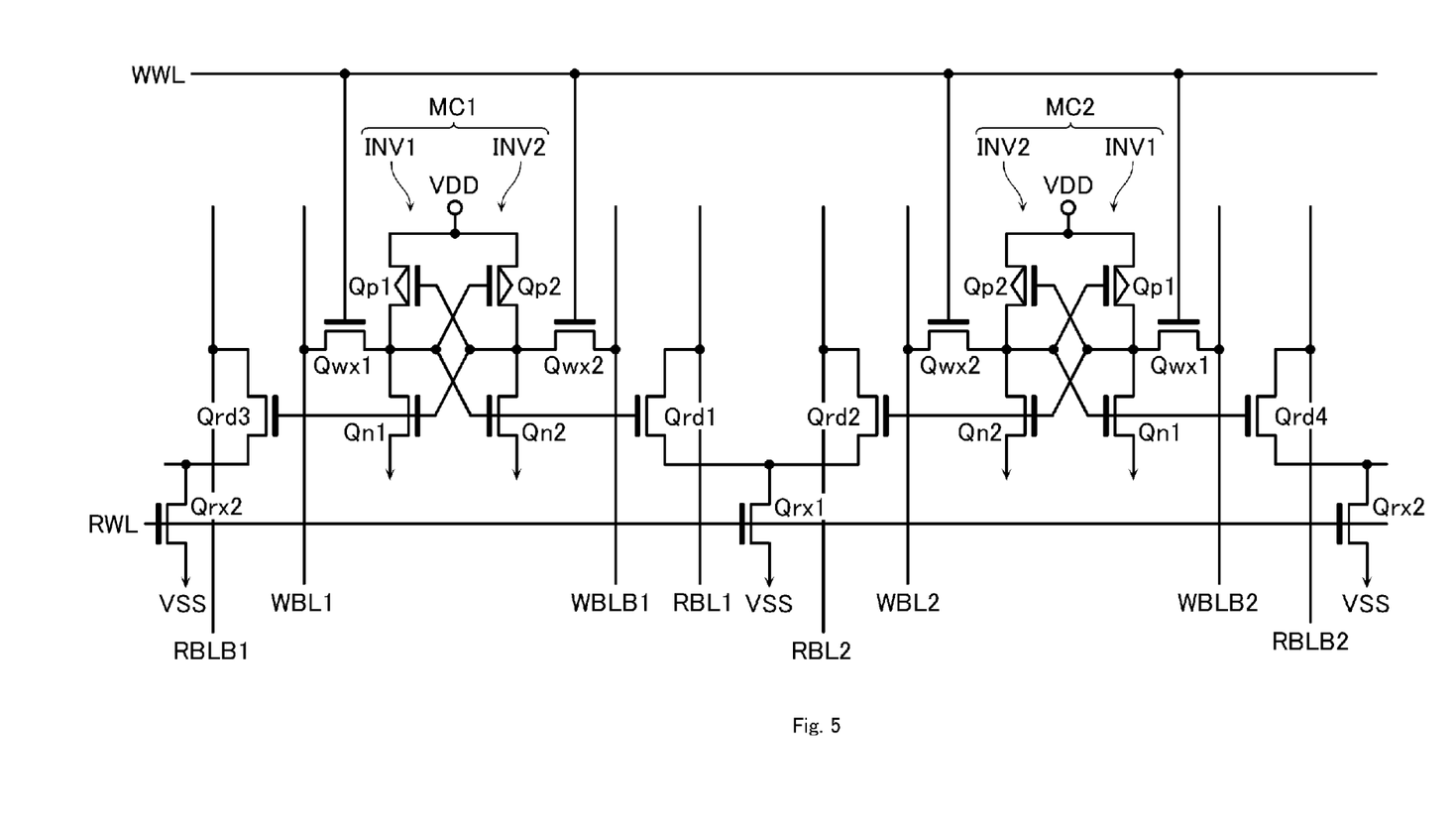
FIG. 5 is a circuit diagram of SRAM cells according to a second embodiment of the present invention.

FIG. 5 is a circuit diagram of SRAM cells MC used in a semiconductor memory device according to a second embodiment of the present invention.

In FIG. 5, the configurations of the SRAM cells MC1 and MC2, the first and second write transfer transistors Qwx1 and Qwx2, the read driver transistors Qrd1 and Qrd2, and the first read transfer transistor Qrx1 are the same as those in the first embodiment. Accordingly, these constituents are designated by the same reference numerals and explanation thereof will be omitted. The semiconductor memory device according to the second embodiment is different from the first embodiment in that the semiconductor memory device includes third and fourth read driver transistors Qrd3 and Qrd4 and second read transfer transistors Qrx2.

A gate of the third read driver transistor Qrd3 is connected to the input terminal of the first inverter INV1 in the SRAM cell MC1. A drain of the third read driver transistor Qrd3 is connected to a read bit line RBLB1, and a source thereof is connected to a drain of the second read transfer transistor Qrx2. A source of the second read transfer transistor Qrx2 is connected to the grounding line VSS, and a gate thereof is connected to the read word line RWL similarly to the first read transfer transistor Qrx1. In this embodiment, the third read driver transistor Qrd3 and the second read transfer transistor Qrx2 also serve as the read port of the SRAM cell MC1.

Meanwhile, a gate of the fourth read driver transistor Qrd4 is connected to the input terminal of the first inverter INV1 in the SRAM cell MC2 which is adjacent to the SRAM cell MC1. A drain of the fourth read driver transistor Qrd4 is connected to a read bit line RBLB2, and a source thereof is connected to a drain of another second read transfer transistor Qrx2. A source of the second read transfer transistor Qrx2 is connected to the grounding line VSS, and a gate thereof is connected to the read word line RWL. In this embodiment, the fourth read driver transistor Qrd4 and the second read transfer transistor Qrx2 also serve as the read port of the SRAM cell MC2.

In the SRAM cell array of this embodiment, the source of the third read driver transistor Qrd3 in the SRAM cell MC1 is connected to a source of a read driver transistor of another adjacent SRAM cell MC which is not illustrated. Moreover, the source of the third read driver transistor Qrd3 in the SRAM cell MC1 and the source of the read driver transistor of the adjacent SRAM cell MC are connected to the second read transfer transistor Qrx2 in common. Meanwhile, the source of the fourth read driver transistor Qrd4 in the SRAM cell MC2 is connected to a source of a read driver transistor of still another adjacent SRAM cell MC which is not illustrated. The source of the fourth read driver transistor Qrd4 and the source of the read driver transistor of the still another adjacent SRAM cell MC are connected to the second read transfer transistor Qrx2 in common. Specifically, the single first read transfer transistor Qrx1 is shared by the two SRAM cells MC1 and MC2 which are adjacent to each other on one side. At the same time, each of the two SRAM cells MC1 and MC2 shares the single second read transfer transistor Qrx2 with the memory cell which is adjacent on the other side.

Figure 6:
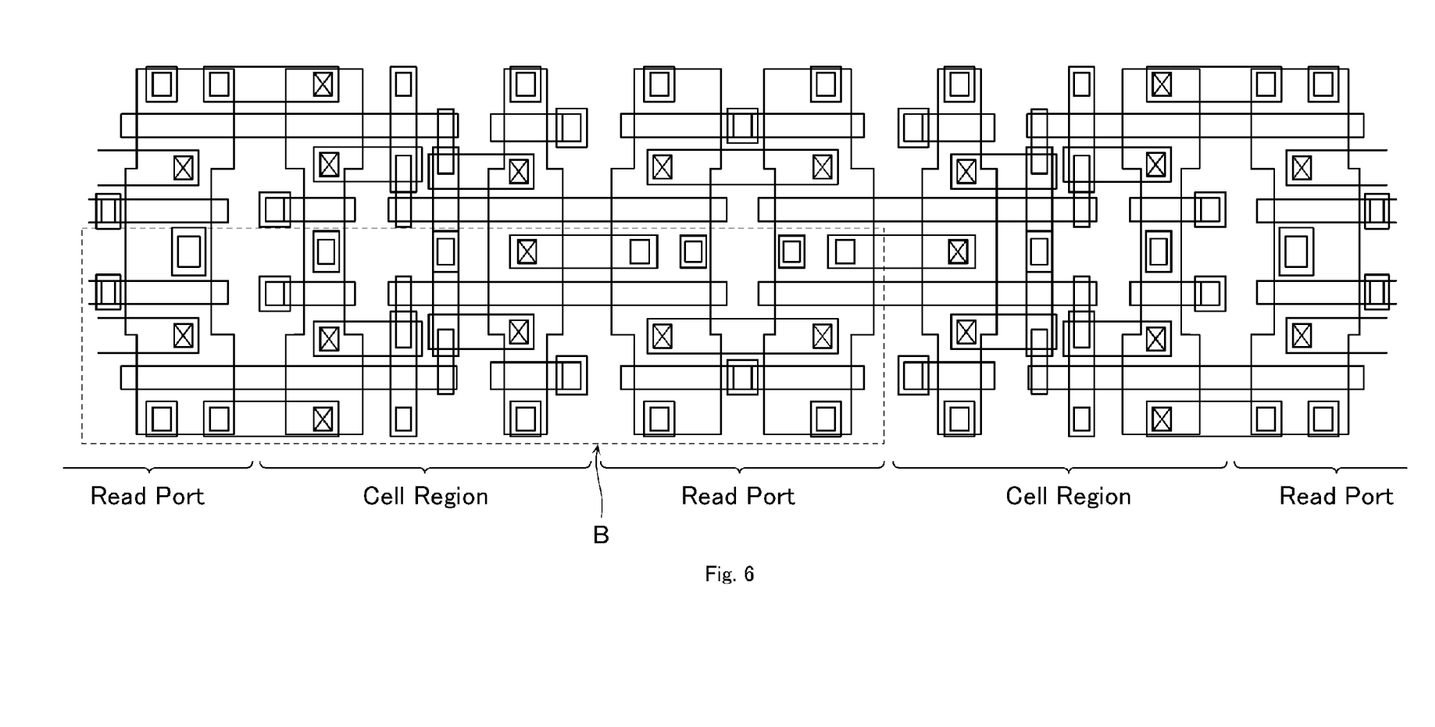
FIG. 6 is a plan view showing a layout of the SRAM cells according to the second embodiment on a semiconductor substrate.
Figure 7:
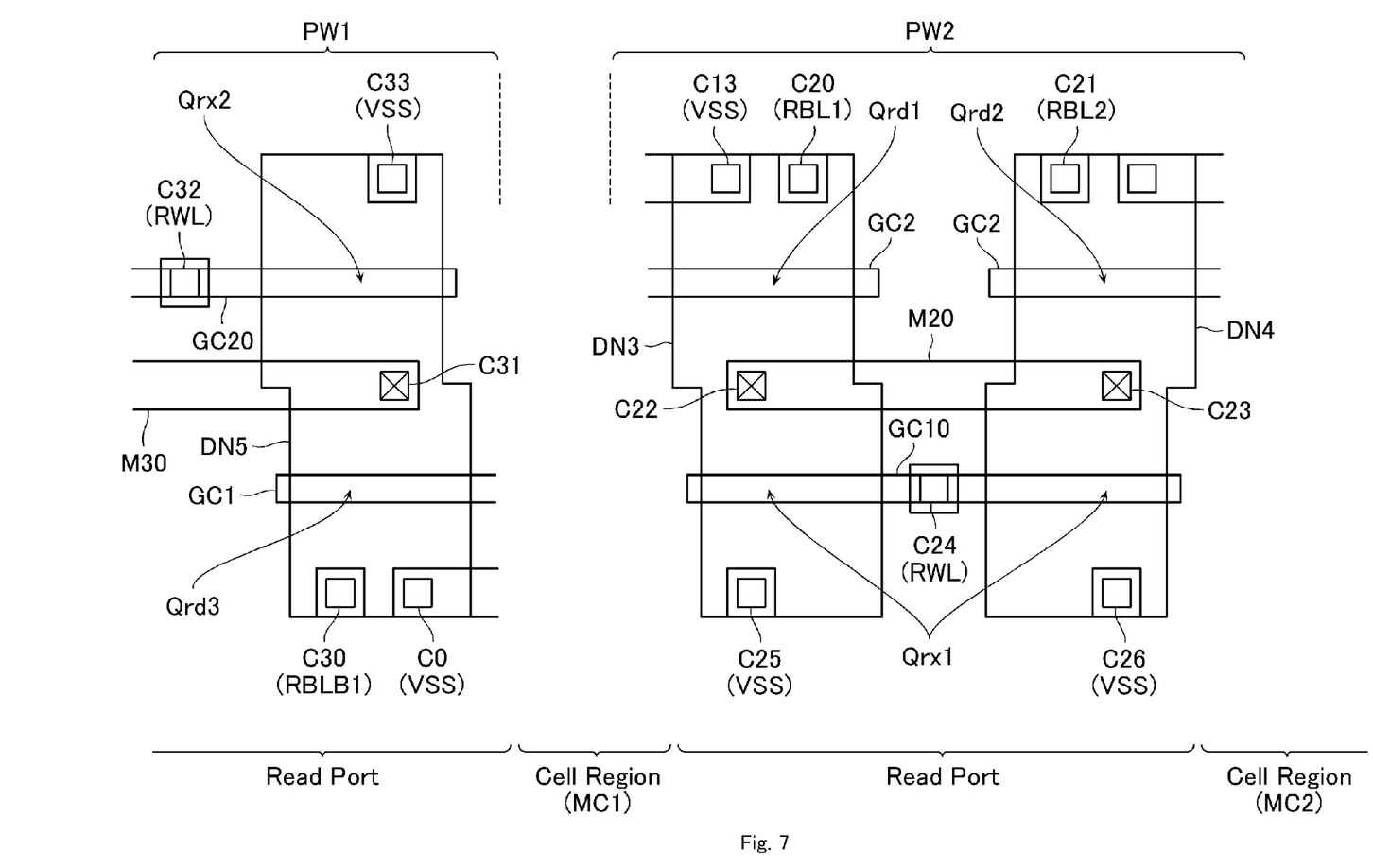
FIG. 7 is an enlarged plan view of the layout of the SRAM cells shown in FIG. 6 on the semiconductor substrate.

FIG. 6 is a plan view showing a layout of the SRAM cells MC of this embodiment on a semiconductor substrate. FIG. 7 is an enlarged plan view of the layout of the SRAM cells MC shown in FIG. 6 on the semiconductor substrate. FIG. 6 shows: the cell regions on the semiconductor substrate where the transistors constituting the SRAM cells MC and the write ports are to be formed; and the read port region on the semiconductor substrate where the transistors constituting the read port are to be formed. FIG. 6 illustrates a layout of four SRAM cells and the read port. Now, concrete configurations of the SRAM cells will be described by using FIG. 7 which is the enlarged view of a portion surrounded by a broken line B in FIG. 6.

In FIG. 7, the layouts of the SRAM cell MC1 and the transistors constituting the write ports are the same as those in the first embodiment and the description thereof will be omitted accordingly. Meanwhile, of the read port, the layouts of the first read driver transistor Qrd1, the second read driver transistor Qrd2, and the first read transfer transistor Qrx1 are the same as those in the first embodiment shown in FIG. 3.

Therefore, these constituents are designated by the same reference numerals and the description thereof will be omitted.

In this embodiment, the transistors constituting the read port are also formed in the p-well region PW1. Specifically, the third read driver transistor Qrd3 used in the SRAM cell MC1 and the second read transfer transistor Qrx2 are formed in the p-well region PW1.

An n-type diffusion layer DN5 having a strip shape and extending parallel to the p-well region PW1 is formed in the p-well region PW1. The first read driver transistor Qrd1 is formed along the n-type diffusion layer DN5 in the p-well region PW1. The gate GC1 common to the transistors Qn1 and Qp1 of the SRAM cell MC1 extends to the n-type diffusion layer DN5 and also serves as a common gate to the third read driver transistor Qrd3. The drain of the third read driver transistor Qrd3 is connected to the read bit line RBLB1 through a contact C30. The source of the third read driver transistor Qrd3 is connected to a metal line M30 through a contact C31.

In the n-type diffusion layer DN5, the source of the third read driver transistor Qrd3 is serially connected to the drain of the second read transfer transistor Qrx2. A gate GC20 of the second read transfer transistor Qrx2 is connected to the read word line RWL through a contact C32, and the source thereof is connected to the grounding line VSS through a contact C33. The second read transfer transistor Qrx2 formed on the n-type diffusion layer DN5 is shared by the adjacent SRAM cell MC which is not illustrated herein.

Figure 8:
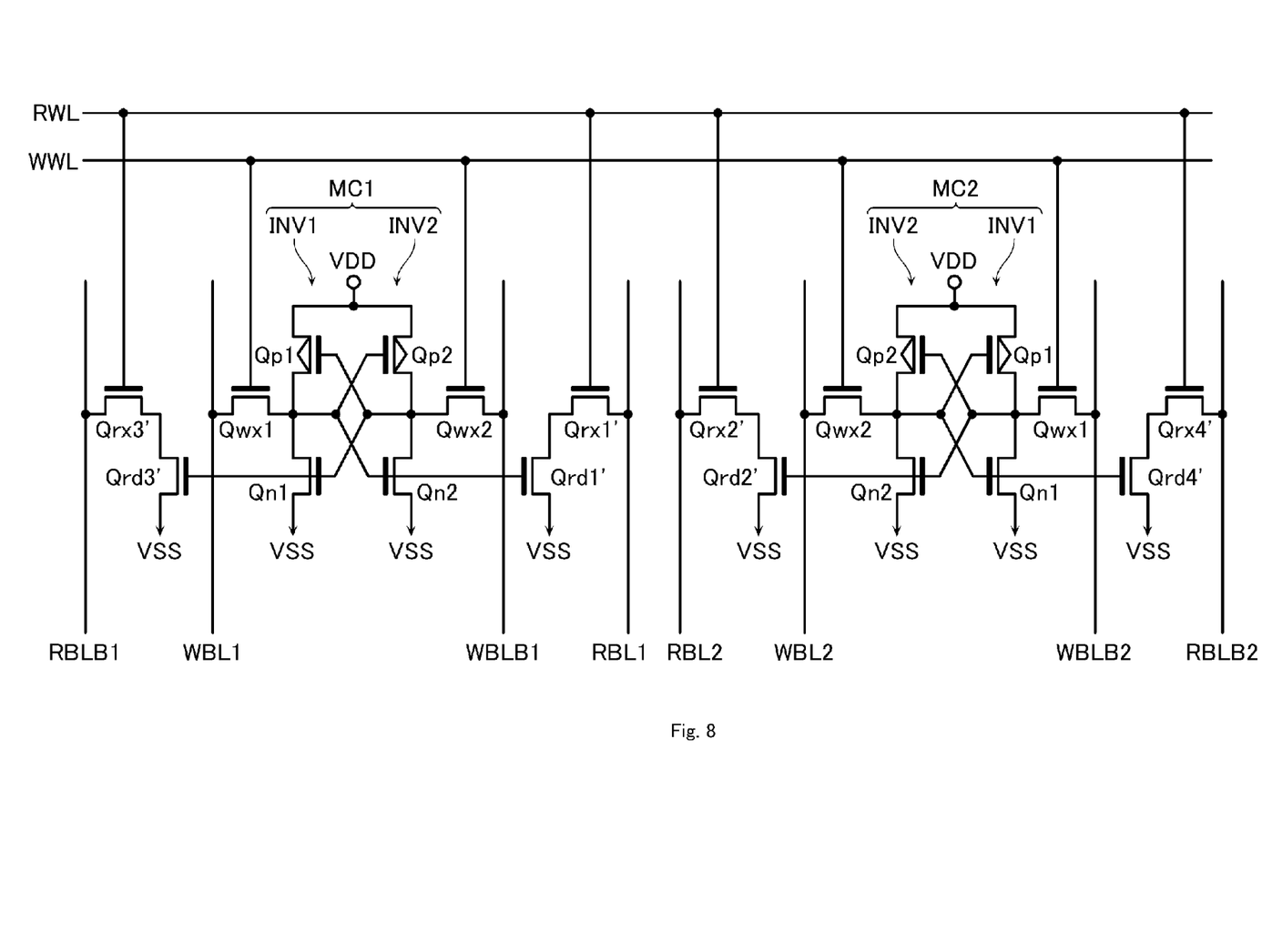
FIG. 8 is a circuit diagram of SRAM cells according to a comparative example.

Next, the read port of this embodiment will be described with reference to FIG. 8. FIG. 8 is a circuit diagram of SRAM cells MC used in a semiconductor memory device of a comparative example. The configurations of the SRAM cells MC1 and MC2, the first and second read driver transistors Qrd1' and Qrd2', and the first and second read transfer transistors Qrx1' and Qrx2' in this comparative example are the same as those in the comparative example of the first embodiment shown in FIG. 4. Accordingly, constituents relevant thereto will be designated by relevant reference numerals and explanation thereof will be omitted. The SRAM cells MC of the comparative example of the second embodiment have different structures of the read driver transistors Qrd and the read transfer transistors Qrx from those in the second embodiment.

A gate of a third read driver transistor Qrd3' is connected to the input terminal of the first inverter INV1 of the SRAM cell MC1. A drain of the third read driver transistor Qrd3' is connected to the first read bit line RBLB1 through a third read transfer transistor Qrx3'. Meanwhile, a source of the third read driver transistor Qrd3' is connected to the grounding line VSS.

A gate of a fourth read driver transistor Qrd4' is connected to the input terminal of the first inverter INV1 of the SRAM cell MC2 which is adjacent to the SRAM cell MC1. A drain of the fourth read driver transistor Qrd4' is connected to the second read bit line RBLB2 through a fourth read transfer transistor Qrx4'. Meanwhile, a source of the fourth read driver transistor Qrd4' is connected to the grounding line VSS. Gates of the read transfer transistors Qrx3' and Qrx4' are connected to the read word line RWL.

In FIG. 8, the read driver transistors Qrd1' to Qrd4' and the read transfer transistors Qrx1' to Qrx4' constitute the read port. Accordingly, in the semiconductor memory device of the comparative example, one memory cell inclusive of the read port is formed by using ten transistors. In the semiconductor memory device of the comparative example, when data is read out of the SRAM cells MC, the read transfer transistors Qrx1' to Qrx4' are conducted by selecting the read word line RWL. Meanwhile, the conducted and non-conducted states of the read driver transistors Qrd1' to Qrd4' are controlled on the basis of the data in the SRAM cells MC. Here, it is possible to detect data held in the SRAM cells MC by feeding the read current to the read bit lines RBL1, RBLB1, RBL2, and RBLB2 to check whether or not the read current is discharged to the grounding line VSS.

The semiconductor memory device of the comparative example includes the read transfer transistors Qrx1' to Qrx4' which are provided on drain sides of the read driver transistors Qrd1' to Qrd4'. The drain sides of the read driver transistors Qrd1' to Qrd4' must be connected to the bit lines RBL1, RBL2, RBLB1, and RBLB2 separately. Therefore, it is not possible to perform control unless separate transistors are used in the respective bit lines.

On the other hand, in the SRAM cells MC according to the above-described second embodiment, the first read transfer transistor Qrx1 is disposed on the source sides of the read driver transistors Qrd1 and Qrd2 respectively of each adjacent two SRAM cells MC, and is shared by the two SRAM cells MC. Moreover, the second read transfer transistor Qrx2 is disposed on the source sides of the driver transistors Qrd3 and Qrd4 respectively of each adjacent two SRAM cells MC and is shared by the two SRAM cells. Since the source sides of the read driver transistors Qrd1 to Qrd4 constituting the two pairs are connected to the grounding line VSS, it is possible to control the conducted and non-conducted states of these transistors by using the two read transfer transistors. In this way, in the SRAM cells MC according to this embodiment, the number of transistors disposed on the read port can be reduced by two for every two cells. Therefore, it is possible to reduce the cell size of the SRAM cells MC.

Third Embodiment

Figure 9:
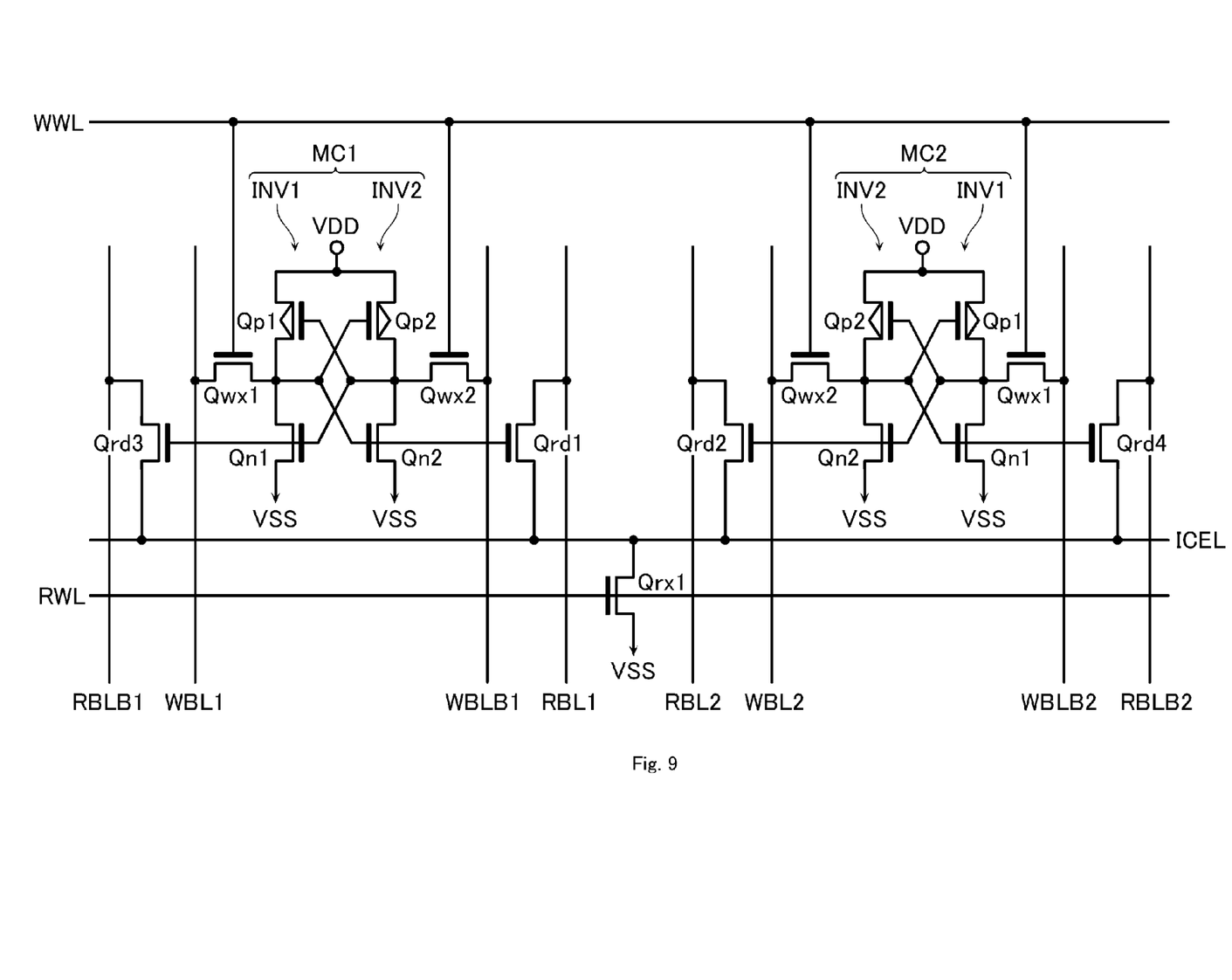
FIG. 9 is a circuit diagram of SRAM cells according to a third embodiment of the present invention.

FIG. 9 is a circuit diagram of SRAM cells MC used in a semiconductor memory device according to a third embodiment of the present invention.

In FIG. 9, the configurations of the SRAM cells MC1 and MC2, and the first and second write transfer transistors Qwx1 and Qwx2 are to the same as those in the second embodiment. Accordingly, these constituents are designated by the same reference numerals and explanation thereof will be omitted. The semiconductor memory device according to the third embodiment has different configurations of the read driver transistors Qrd1, Qrd2, Qrd3, and Qrd4 and of the first read transfer transistor Qrx1 from those in the second embodiment.

The gate of the first read driver transistor Qrd1 is connected to the input terminal of the second inverter INV2 in the SRAM cell MC1, and the gate of the third read driver transistor Qrd3 is connected to the input terminal of the first inverter INV1. The drains of the first and third read driver transistors Qrd1 and Qrd3 are connected to the read bit lines RBL1 and RBLB1, respectively. In the semiconductor memory device of this embodiment, the sources of the first and third read driver transistors Qrd1 and Qrd3 are connected to each other through a common source line ICEL. The drain of the first read transfer transistor Qrx1 is connected to this common source line ICEL, and the source thereof is connected to the grounding ling VSS. Meanwhile, the gate of the first read transfer transistor Qrx1 is connected to the read word line RWL.

Meanwhile, the gate of the second read driver transistor Qrd2 is connected to the input terminal of the second inverter INV2 in the SRAM cell MC2 which is adjacent to the SRAM cell MC1, and the gate of the fourth read driver transistor Qrd4 is connected to the input terminal of the first inverter INV1. The drains of the second and fourth read driver transistors Qrd2 and Qrd4 are connected to the read bit lines RBL2 and RBLB2, respectively. The sources of the second and fourth read driver transistors Qrd2 and Qrd4 are also connected to each other through the common source line ICEL as well as to the drain of the first read transfer transistor Qrx1.

In this SRAM cell array, the sources of the first and third read driver transistors Qrd1 and Qrd3 of the SRAM cell MC1 are connected to the sources of the second and fourth read driver transistors Qrd2 and Qrd4 of the adjacent SRAM cell MC2 through the common source line ICEL. Here, read driver transistors Qrd of the multiple SRAM cells (not shown) that are adjacent in a direction of extension of the word lines WWL and RWL are similarly connected to the common source line ICEL and connected to the first read transfer transistor Qrx1 in common. Specifically, in the memory cell array, the single read transfer transistor Qrx1 is shared by the multiple SRAM cells that are arranged in the direction of the word lines.

In the SRAM cells MC according to the third embodiment, the first read transfer transistor Qrx1 is disposed on the source sides of the read driver transistors Qrd1 to Qrd4 and is shared by the multiple SRAM cells. Since the source sides of the read driver transistors Qrd1 to Qrd4 are connected to the grounding line VSS, it is possible to control the conducted and non-conducted states of these transistors by using the single read transfer transistor. In this way, in the SRAM cells according to this embodiment, the number of transistors disposed on the read port can be reduced by approximately two for every cell in comparison with the ten-transistor-type SRAM cells shown in FIG. 8. Therefore, it is possible to reduce the cell size of the SRAM cells MC.

(Another Example of Third Embodiment)

Figure 10:
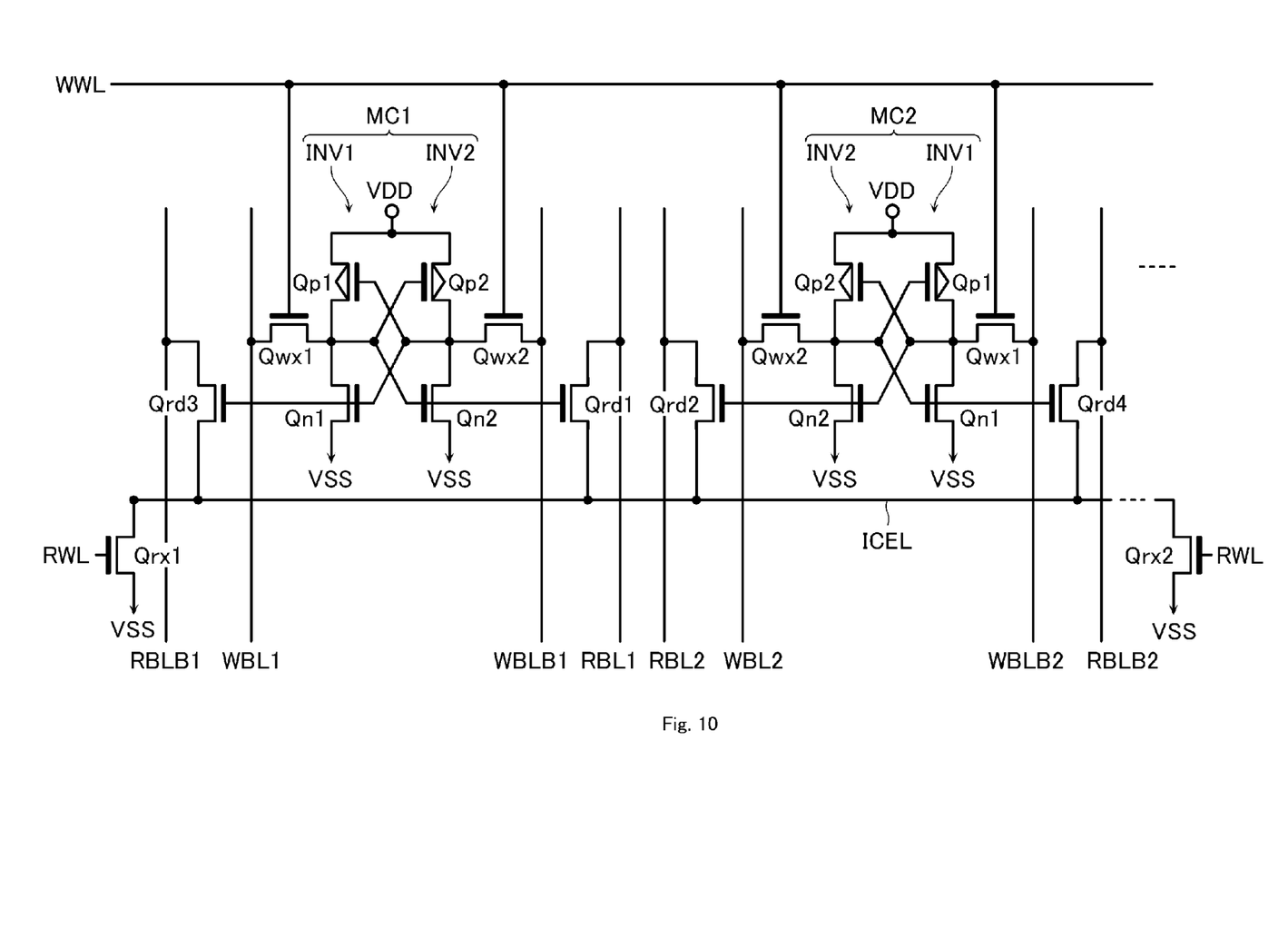
FIG. 10 is a circuit diagram of SRAM cells according to another example of the third embodiment.

FIG. 10 is a circuit diagram of SRAM cells MC used in a semiconductor memory device according to another example of the third embodiment of the present invention.

In FIG. 10, the configurations of the SRAM cells MC1 and MC2, the first and second write transfer transistors Qwx1 and Qwx2, and the read driver transistors Qrd1 to Qrd4 are the same as those in the third embodiment. Accordingly, these constituents are designated by the same reference numerals and explanation thereof will be omitted. The semiconductor memory device of this example is different from the third embodiment in that the first read transfer transistor Qrx1 is connected in a different manner and that the semiconductor memory device includes the second read transfer transistor Qrx2.

The sources of the first and third read driver transistors Qrd1 and Qrd3 are connected to each other through the common source line ICEL. Meanwhile, the sources of the second and fourth read driver transistors Qrd2 and Qrd4 are also connected to each other through the common source line ICEL. The first read transfer transistor Qrx1 of this example is located at an end of the memory cell array provided with the multiple SRAM cells MC. The drain of the first read transfer transistor Qrx1 is connected to one end of the common source line ICEL, and the source thereof is connected to the grounding line VSS. Meanwhile, the gate of the first read transfer transistor Qrx1 is connected to the read word line RWL.

Moreover, in this example, the second read transfer transistor Qrx2 is located at the other end of the memory cell array provided with the multiple SRAM cells MC. The drain of the second read transfer transistor Qrx2 is connected to the other end of the common source line ICEL, and the source thereof is connected to the grounding line VSS. Meanwhile, the gate of the second read transfer transistor Qrx2 is also connected to the read word line RWL.

Here, the read driver transistors Qrd of the multiple SRAM cells (not shown) that are adjacent in the direction of extension of the word lines WWL and RWL are similarly connected to the common source line ICEL and connected to the first and second read transfer transistors Qrx1 and Qrx2 in common. Specifically, in the memory cell array, the first and second read transfer transistors Qrx1 and Qrx2 are shared by the multiple SRAM cells that are arranged in the direction of the word lines.

In the SRAM cells MC according to this example of the third embodiment, the first and second read transfer transistors Qrx1 and Qrx2 are disposed on the source sides of the read driver transistors Qrd1 to Qrd4 and are shared by the multiple SRAM cells. In this way, in the SRAM cells MC according to this example, the number of transistors disposed on the read port can be reduced by approximately two for every cell in comparison with the ten-transistor-type SRAM cells shown in FIG. 8. Therefore, it is possible to reduce the cell size of the SRAM cells MC. Moreover, since the read transfer transistors Qrx1 and Qrx2 are located outside the memory cell array, the sizes of the read transfer transistors are not restricted by the layout inside the memory cell array. For this reason, it is possible to form the read transfer transistors Qrx1 and Qrx2 large enough that a sufficient read current can be fed. In addition, since it is not necessary to locate the read word line RWL in the metal line layer above the memory cell array, it is easier to arrange the layout of the upper metal line layer for providing the bit lines, the word lines, and so forth.

Figure 11A:
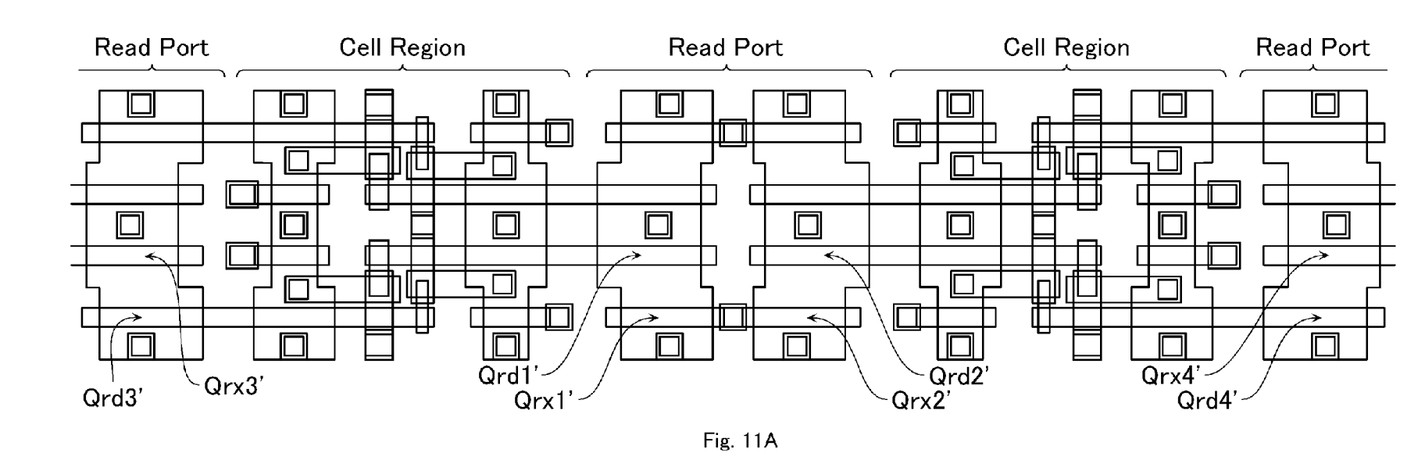
FIGS. 11A and 11B is each a plan view of a layout, on a semiconductor substrate, of the SRAM cells of the example of the third embodiment.
Figure 11B:
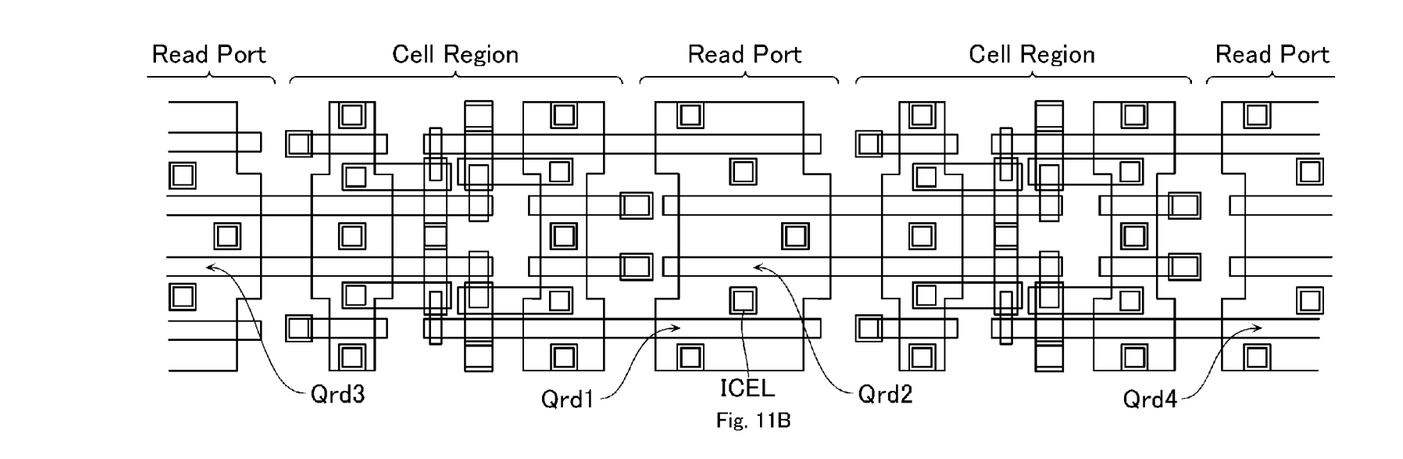

FIGS. 11A and 11B are plan views for showing the layouts, on the semiconductor substrate, of the ten-transistor-type SRAM cells MC shown in FIG. 8 and of the SRAM cells MC of this example. FIG. 11A shows the ten-transistor-type SRAM cells MC shown in FIG. 8, and FIG. 11B shows the SRAM cells MC of this example.

The transistors constituting the SRAM cells MC and the write ports are provided in the cell regions shown in FIG. 11A. Moreover, in the read port regions, the read driver transistors Qrd1' to Qrd4' constituting the read ports of the ten-transistor-type SRAM cells shown in FIG. 8 are provided. Furthermore, the read transfer transistors Qrx1' to Qrx4' for connecting the read driver transistors Qrd1' to Qrd4' respectively to the read bit lines RBL1, RBL2, RBLB1, and RBLB2 are provided therein.

The transistors constituting the SRAM cells MC and the write ports are provided in the cell regions shown in FIG. 11B. Here, only the read driver transistors Qrd1 to Qrd4 constituting the read ports of the SRAM cells shown in FIG. 10 are provided in the read port regions. The sources of the read driver transistors Qrd1 to Qrd4 are connected to the common source line ICEL through the contacts. Here, the read transfer transistors Qrx1 and Qrx2 are respectively provided at the ends of the unillustrated memory cell array, and configured to connect the common source line ICEL to the ground line VSS.

As shown in FIGS. 11A and 11B, it is possible to reduce the total area of the cell regions where the SRAM cells MC of this example are formed and of the read port regions (see FIG. 11B) by approximately 15% in comparison with the total area of the cell regions of the comparative example and of the read port regions in (see FIG. 11A). Moreover, the regions where the read driver transistors Qrd1 to Qrd4 constituting the read ports of the SRAM cells are formed are shared in this example. Accordingly, it is possible to expand channel widths of the transistors. In this way, it is possible to reduce the resistance of the transistors and to increase the cell current to flow through the read driver transistors by approximately 66%.

This reduction in the cell size and the improvement in a readout characteristic are adjustable on the basis of specifications required for the operation of the semiconductor memory device. For example, when the readout characteristic is sufficiently ensured, it is possible to further reduce the cell size by setting the cell current to the same value as that applicable to the semiconductor memory device of the comparative example. Alternatively, it is also possible to increase the cell current and to improve the readout characteristic while maintaining the same cell size as that of the semiconductor device of the comparative example.

Fourth Embodiment

Figure 12:
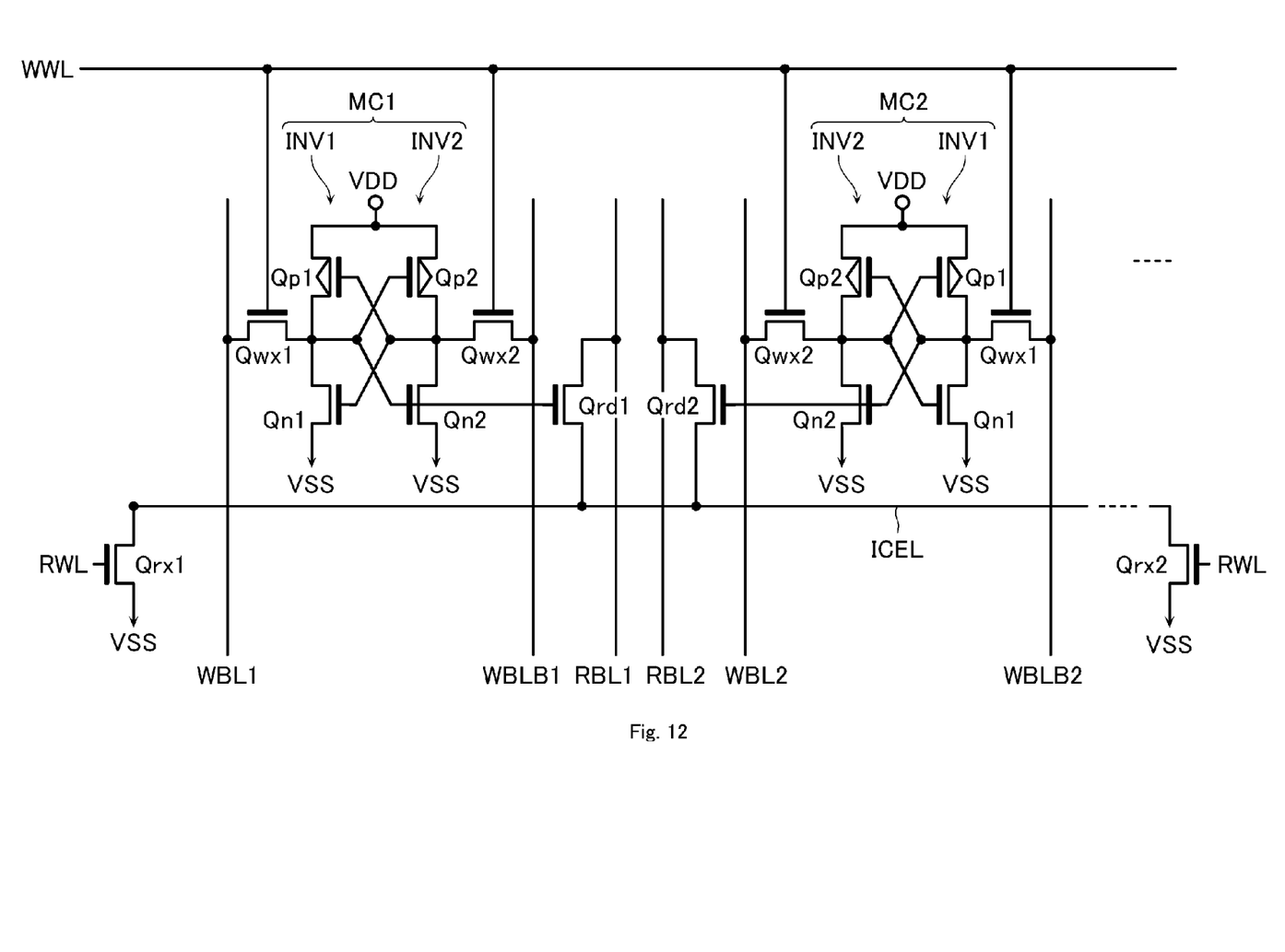
FIG. 12 is a circuit diagram of SRAM cells according to a fourth embodiment of the present invention.

FIG. 12 is a circuit diagram of SRAM cells MC used in a semiconductor memory device according to a fourth embodiment of the present invention.

In FIG. 12, the configurations of the SRAM cells MC1 and MC2, the first and second write transfer transistors Qwx1 and Qwx2, and the read driver transistors Qrd1 and Qrd2 are the same as those in the third embodiment. Accordingly, these constituents are designated by the same reference numerals and explanation thereof will be omitted. The semiconductor memory device according to the fourth embodiment is different from the third embodiment in that the third and fourth read transfer transistors Qrd3 and Qrd4 are not provided therein and that the semiconductor memory device is formed as eight-transistor-type SRAM cells as shown in FIG. 4.

In this embodiment as well, the sources of the first and second read driver transistors Qrd1 and Qrd2 are connected to each other through the common source line ICEL. Moreover, the first and second read transfer transistors Qrx1 and Qrx2 are respectively provided at the ends of the memory cell array that includes the multiple SRAM cells MC. The drains of the first and second read transfer transistors Qrx1 and Qrx2 are respectively connected to the two ends of the common source line ICEL, and the sources thereof are connected to the grounding line VSS. Further, the gates of the first and second read transfer transistors Qrx1 and Qrx2 are connected to the read word line RWL.

Here, the read driver transistors Qrd of the multiple SRAM cells (not shown) that are adjacent in the direction of extension of the word lines WWL and RWL are similarly connected to the common source line ICEL and connected to the first and second read transfer transistors Qrx1 and Qrx2 in common. Specifically, in the memory cell array, the first and second read transfer transistors Qrx1 and Qrx2 are shared by the multiple SRAM cells that are arranged in the direction of the word lines.

In the SRAM cells MC according to the fourth embodiment, the first and second read transfer transistors Qrx1 and Qrx2 are disposed on the source sides of the read driver transistors Qrd1 and Qrd2 and are shared by the multiple SRAM cells. In this way, in the SRAM cells of this embodiment, the number of transistors disposed on the read port can be reduced by approximately one for every cell in comparison with the eight-transistor-type SRAM cells shown in FIG. 4. Therefore, it is possible to reduce the cell size of the SRAM cells MC.

Although the embodiments of the present invention have been described above, it is to be understood that the invention will not be limited only to these embodiments and various other modifications, additions, and the like, are possible without departing from the scope and spirit of the invention.

While the exemplary embodiments may be subject to various modifications and expressed in alternative forms, the embodiments discussed herein are non-limiting examples. It should be understood that the drawings and detailed description are not intended to limit the invention to the particular embodiments which are described. This disclosure is instead intended to cover all modifications, equivalents and alternatives falling within the scope of the present invention as defined by the appended claims.

The invention claimed is:

1. A semiconductor memory device comprising:
   a first write bit line;
   a second write bit line;
   a write word line;
   a first read bit line;
   a read word line; and
   a memory cell array comprising a plurality of memory cells in a matrix;
   wherein the memory cells comprising:
   a first inverter comprising a first PMOS transistor and a first NMOS transistor;
   a second inverter comprising a second PMOS transistor, and a second NMOS transistor, and comprising an input terminal and an output terminal connected to an output terminal and an input terminal of the first inverter, respectively;
   a first write transfer transistor connected between a first write bit line and the output terminal of the first inverter, and comprising a gate connected to a write word line;
   a second write transfer transistor connected between a second write bit line and the output terminal of the second inverter, and comprising a gate connected to the write word line;
   a first read driver transistor comprising a gate connected to the input terminal of either the first inverter or the second inverter; and
   a first read transfer transistor connected to a first read bit line through the first read driver transistor, and comprising a gate connected to a read word line, the first read transfer transistor shared by at least two of the memory cells in the memory cell array.

2. The semiconductor memory device of claim 1, wherein terminals of the first read driver transistors of the adjacent two memory cells are connected to each other, and the first read transfer transistor is shared by the two adjacent memory cells.

3. The semiconductor memory device of claim 2, wherein the adjacent two memory cells are line-symmetric with the first read transfer transistor.

4. The semiconductor memory device of claim 3, wherein the gate of the first read transfer is connected to the read word line via a gate contact, and the adjacent two memory cells are line-symmetric with the gate contact.

5. The semiconductor memory device of claim 1, further comprising:
   a second read driver transistor comprising a gate connected to the input terminal of the inverter not connected to the gate of the first read driver; and
   a second read transfer transistor connected to a second read bit line through the second read driver transistor, and comprising a gate connected to the read word line, wherein:
      a terminal of the first read driver transistor of the memory cell is connected to a terminal of the first read driver transistor of an first adjacent memory cell, the first adjacent memory cell being at a first side of the memory cell,
      the first read transfer transistor is shared by the memory cell and the first adjacent memory cell,
      a terminal of the second read driver transistor of the memory cell is connected to a terminal of the second read driver transistor of a second adjacent cell, the second adjacent memory cell being at a second side of the memory cell, and
      the second read transfer transistor is shared by the memory cell and the second adjacent static random access memory (SRAM) cell.

6. The semiconductor memory device of claim 1, further comprising:
   a second read driver transistor including a gate connected to the input terminal of the other one of the first inverter and the second inverter,
   wherein:
      terminals of the first and second read driver transistors of the plurality of memory cells in one direction are connected in common, and
      the first read transfer transistor is shared by the plurality of memory cells in the one direction.

7. The semiconductor memory device of claim 6, wherein the first read transfer transistor is at a first end of the memory cell array.

8. The semiconductor memory device of claim 7, further comprising:
   a second read transfer transistor connected to the first read bit line through the first read driver transistor, comprising a gate connected to a read word line, and shared by the plurality of memory cells in the one direction,
   wherein the second read transfer transistor is at a second end of the memory cell array.

9. The semiconductor memory device of claim 8, wherein the first read transfer transistor and the second read transfer transistor are connected to a ground.

10. The semiconductor memory device of claim 1, wherein, in the memory cell array,
    terminals of the first read driver transistors of the plurality of memory cells in one direction are connected in common, and
    the first read transfer transistor is shared by the plurality of memory cells in the one direction.

11. The semiconductor memory device of claim 10, wherein the first read transfer transistor is at a first end of the memory cell array.

12. The semiconductor memory device of claim 11, further comprising:
    a second read transfer transistor connected to the first read bit line through the first read driver transistor, comprising a gate connected to a read word line, and shared by the plurality of memory cells in the one direction,
    wherein the second read transfer transistor is at a second end of the memory cell array.

13. The semiconductor memory device of claim 12, wherein the first read transfer transistor and the second read transfer transistor are connected to a ground.

14. The semiconductor memory device of claim 1, wherein the a first read transfer transistor is connected to a ground.

15. The semiconductor memory device of claim 1, wherein:
    the first NMOS transistor is point-symmetric with the second NMOS transistor,
    the first PMOS transistor is point-symmetric with the second PMOS transistor, and
    the first write transfer transistor is point-symmetric with the second write transfer transistor.

* * * * *